(12) United States Patent
Schmidt

(10) Patent No.: US 6,172,587 B1
(45) Date of Patent: *Jan. 9, 2001

(54) FERROMAGNETIC SPATIAL SHIELDING FOR THE SUPERCONDUCTING HIGH FIELD MAGNET OF AN NMR SPECTROMETER

(75) Inventor: Hartmut Schmidt, Karlsruhe (DE)

(73) Assignee: Bruker Analytik GmbH, Rheinstetten (DE)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/928,423

(22) Filed: Sep. 12, 1997

(30) Foreign Application Priority Data

Sep. 19, 1996 (DE) .............................. 196 38 230

(51) Int. Cl.[7] ......................................... H01F 1/00
(52) U.S. Cl. ........................................ 335/296; 335/301
(58) Field of Search ................... 335/216, 296, 335/299, 300, 301; 194/35 MS, 35 R; 324/318, 319, 320, 321

(56) References Cited

U.S. PATENT DOCUMENTS

| | | |
|---|---|---|
| 4,490,675 | 12/1984 | Knuettel et al. . |
| 4,635,017 | 1/1987 | Ries . |
| 4,651,099 | 3/1987 | Vinegar . |
| 4,755,630 | 7/1988 | Smith . |
| 5,012,217 | 4/1991 | Palkovich et al. . |
| 5,220,302 | 6/1993 | Nunnally et al. . |
| 5,323,135 * | 6/1994 | Schmidt et al. ............... 335/299 |
| 5,446,434 * | 8/1995 | Dorri et al. ................... 335/301 |
| 5,469,123 | 11/1995 | Müller . |
| 5,563,567 * | 10/1996 | Westphal ....................... 335/299 |

FOREIGN PATENT DOCUMENTS

| | | |
|---|---|---|
| 3123493 | 12/1982 | (DE) . |
| 4415847 | 8/1995 | (DE) . |
| 0182284 | 5/1986 | (EP) . |
| 0196511 | 10/1986 | (EP) . |
| 0434247 | 6/1991 | (EP) . |
| 2214312 | 8/1989 | (GB) . |

OTHER PUBLICATIONS

"Introducing new technology for very high field NMR spectrometers" Houston Advanced Research Center, company brochure (1993) (No Month).

"A Cylindrically Symmetric Magnetic Shield for a Large–Bore 3.0 Tesla Magnet" by Ewing et al., MRM 29, pp. 398–401, (1993). (No Month).

* cited by examiner

Primary Examiner—Lincoln Donovan
(74) Attorney, Agent, or Firm—Paul Vincent

(57) ABSTRACT

Magnetic shielding for a superconducting magnet coil, arranged in the inside of a cryostat and having a vertical z-axis for generating a static magnetic field of a homogeneity of $<10^{-7}$ in the measuring volume of an NMR spectrometer, wherein the shielding comprises spatial shielding at a distance from the cryostat in the form of a ferromagnetic shielding plate arranged above the cryostat, is characterized in that the shielding plate comprises either areas outside of the z-axis having a final curvature in the downward direction or plane surfaces which are inclined with respect to the horizontal line at an angle $10°<\theta<60°$, truncated conical or truncated pyramid shaped surfaces. In this manner, the magnetic flux in a room located above the spectrometer is minimized and the expenditure for material and assembly for the shielding elements is considerably reduced.

15 Claims, 7 Drawing Sheets

FERROMAGNETIC SPATIAL SHIELDING FOR THE SUPERCONDUCTING HIGH FIELD MAGNET OF AN NMR SPECTROMETER

This application claims Paris Convention priority of German patent application 196 38 230.0 filed Sep. 19, 1996, the complete disclosure of which is hereby incorporated by reference.

BACKGROUND OF THE INVENTION

The invention concerns magnetic shielding for a superconducting magnet coil arranged in the inside of a cryostat and having a vertical z-axis for generating a static magnetic field of a homogeneity of $<10^{-7}$ in the test volume of a nuclear magnetic resonance (NMR) spectrometer, wherein the shielding comprises spatial shielding at a distance from the cryostat in the form of a ferromagnetic shielding plate which is disposed above the cryostat.

Magnetic shielding of this type is known from DE 44 15 847 C.

The problems inherent in magnetic spatial shielding in the field of analytic NMR are described in detail in the above-mentioned document DE 44 15 847 C1. From U.S. Pat. No. 5,220,302 cited therein, "stave-like" magnetic shielding of a high field NMR magnet is known, in which the shielding elements surround the cryostat of the apparatus in the form of strip-like segments of a spherical shell at a distance symmetrically with respect to the central measuring volume.

The axial end areas are not shielded in this case. Consequently, the produced magnetic stray field can be shielded to the side, however, it emerges towards the top in an almost unhindered manner, such that, in a space located above the NMR spectrometer, it can fully develop its disturbing effect on sensitive devices.

The company leaflet "Introducing new technology for very high field NMR-spectrometers" from the Houston Advanced Research Center, 4800 research forest drive, The Woodlands, Tex. 77381, USA from the year 1993, discloses an integrated iron shielding of an NMR spectrometer, which is cooled down to the temperature of liquid helium.

In the field of NMR tomography, e.g. the article "A Cylindrically Symmetric Magnetic Shield for a Large-Bore 3.0 Tesla Magnet" by Ewing et al., MRM 29, Pages 398–401, 1993, discloses shielding chambers which are closed on all sides or are symmetrical. In such closed and symmetrical tomography shieldings, the NMR magnet coil is in the centre of symmetry of the whole arrangement.

Also from the field of NMR tomography, magnetic spatial shielding has become known through EP 0 182 284 B1 in which the thickness of the shielding can be varied and thus locally optimized. From the drawings shown in the document, it can be gathered that the shielding chamber consists of walls which are parallel to the axis, i.e. either of two side walls or a pipe which is arranged around the magnet and comprises either a circular cross-section or an n-fold, polygonal cross-section, or of a box-shaped configuration which has rectangular openings in the axial direction and has a square or coffin-like shape.

EP 0 196 511 B1 describes ferromagnetic shielding for NMR magnets, wherein the axial opening of an iron shielding cylinder, which directly surrounds the superconducting magnet, is calculated such that the field distortion in the test volume is as small as possible. In this manner, "retrofitting" of originally not shielded systems is to be realized.

U.S. Pat. No. 4,635,017 again shows a shielding arrangement for an NMR tomography magnet, wherein in this case "wings" are provided which protrude in the axial or radial direction from the magnet and are designed to capture part of the magnetic stray field.

Also from the field of NMR tomography there is finally known through DE 31 23 493 A1 ferromagnetic shielding which surrounds the magnet system in a relatively compact manner, in which variants with magnet coils having a vertical z-axis and shielding means having a horizontal or slightly curved "lid" are provided. Improved field homogeneity in the upper area of the test volume is regarded as an advantage of the curved "lid" wherein, however, in this type of tomography arrangement, the achievable magnetic field homogeneity in the measuring volume is by far worse than the homogeneity required for an NMR spectrometer. Furthermore, this does not concern spatial shielding at a distance from the magnet system but compact shielding which surrounds a normally conducting magnet coil system so that the problems with the use of a cryostat for superconducting magnet coils do not occur in this case either.

In contrast thereto, the initially cited DE 44 15 847 C1 describes magnetic spatial shielding for a superconducting NMR analytic magnet, wherein the ferromagnetic shielding is spaced away from the cryostat and contains at least two horizontally arranged plates, one of which is arranged below and the other above the cryostat. Moreover, vertical ferromagnetic side elements are provided which magnetically connect the upper and the lower plate. In this manner, shielding is effected which is considerably improved with respect to all other shielding devices for NMR analytic magnets hitherto known, wherein no major problems with respect to the action of forces nor significant disturbances of the homogeneity of the generated static magnetic field occur.

A disadvantage of this arrangement is still the fact that a considerable part of the magnetic stray field can leave the NMR spectrometer and enter into spaces located above the spectrometer. Even the application of a canopy-like surrounding "apron", provided in DE 44 15 847 C1, still allows that a very large amount of magnetic flux enters towards the top through the shielding. Furthermore, there is also the disadvantage that the known device requires a considerable amount of ferromagnetic shielding material which can cause, on the one hand, weight problems and problems with the statics of the building and, on the other hand, requires great expenditure in connection with the assembly.

Thus, it is the object of the present invention to improve magnetic spatial shielding having the initially mentioned features in such a manner that the magnetic flux in a room located above the spectrometer is minimized, if possible, completely eliminated and that the expenditure in connection with material and assembly for the shielding elements is considerably reduced.

SUMMARY OF THE INVENTION

According to a first aspect of the invention, this object is achieved in accordance with the invention in a manner which is both surprisingly simple and effective, in that the shielding plate comprises areas having a final downward curvature outside of the z-axis, wherein, in the area of the axis above the cryostat, the shielding plate extends in the horizontal direction like in the device described in DE 44 15 847 C1.

In contrast to the known flat shielding plates, at the edges of which the lines of flux penetrate in the upward direction which, by the way, through merely increasing the size of the horizontal plate could be improved only slightly due to the weight problems connected therewith, by means of the shielding plate according to the invention which is pulled down at the edges thereby exhibiting a slight curvature, the magnetic flux is "trapped" in a considerably better manner. Also with respect to the known "canopy solution", the shielding according to the invention shows considerable improvement of the shielding effect towards the top and, additionally, a considerable reduction of the mass of the ferromagnetic shielding material used. Since the plate is at a sufficient distance from the magnet system itself, no considerable magnetic forces occur in the shielding system and the magnetic field homogeneity in the measuring centre of the NMR spectrometer is impaired by the shielding arrangement to an adequately small degree such that remaining inhomogeneities due to the shielding can be compensated for by simple shimming.

In a preferred embodiment of the magnetic shielding according to the invention, having a downwardly curved shielding plate, the shielding plate is rotationally symmetric about the z-axis. In this manner, impairment of the field homogeneity of the magnetic field in the measuring centre of the NMR spectrometer is minimized.

In advantageous further developments of this embodiment, the shielding plate has, at least partly, the shape of a spherical shell segment. In particular, the shielding plate may be formed as a sphere up to the z-axis, whereby the highest degree of symmetry is achieved. Further developments, in which the shielding plate is truncated sphere shaped, are easier to produce, wherein a spherical shell-shaped curvature in a downward direction joins the edge of a horizontal part of the shielding plate which extends radially away from the z-axis.

As an alternative, in further developments, the curved areas of the shielding plate may comprise also parabolic or hyperbolic shapes or, in general, variable curvature radii. In this manner, it is possible to optimize the reduction of weight of the shielding plates in dependence upon the respective magnetic field dependence, thereby providing a maximum shielding effect. In particular, when mounting the shielding plate on the lower side of a ceiling construction, it is very important to use masses which are as small as possible.

According to a second aspect of the present invention, the above-mentioned object of the invention is achieved by means of magnetic shielding with the initially mentioned features in that the shielding plate comprises plane surfaces, which are inclined with respect to the horizontal line at an angle of 10°<theta<60°, truncated conical or truncated pyramid shaped surfaces.

Also by means of truncated conical or truncated pyramid shaped downwardly facing edge surfaces of an otherwise plane horizontal shielding plate, on the one hand the magnetic flux from the NMR spectrometer can be shielded effectively with respect to a room located thereabove, wherein on the other hand a considerably small mass of ferromagnetic material is required. With respect to the above-described first aspect of the invention, the shielding effect is somewhat less in this case, however, the production of a plane shielding plate having a truncated conical or truncated pyramid shaped downwardly facing edge causes considerably less expenditure and is cheaper than the above-described shielding plate having areas bent downwardly in the form of a sphere.

Advantageous embodiments of both aspects of the invention may comprise an n-fold symmetry with n>3, preferably n=8, instead of the above-mentioned rotational symmetry about the z-axis. This is advantageous in particular for reasons of production technology, since such a shielding plate is relatively easy to assemble in steps.

In a further embodiment of both aspects of the invention, the shielding plate may have the form of a horizontal plate in the area close to the axis and may drop in one or two steps in the area distant from the axis. This measure also serves for more simple and thus cheaper production of the shielding according to the invention with essentially the same shielding effect thereby using less mass.

In an advantageous further development of this embodiment, the horizontal plate is radially joined by at least one edge section which is composed of n plane trapezoidal plates.

One further development is particularly favourable, in which the horizontal plate is radially joined by exactly two edge sections.

One development is particularly preferred, in which the angle between two adjacent edge sections, in each case, is <20°.

Finally, in a further advantageous embodiment, the shielding plate may be slitted or laminated completely or also only in the edge areas. By this means, the production costs can be considerably reduced. In addition, it is possible to save weight and, finally, there is the further advantage that the setting in of eddy currents in the shielding plate, when switching the magnetic field gradient in the NMR apparatus and the disadvantages for the homogeneity of the magnetic field in the measuring centre resulting therefrom is made more difficult or is completely prevented.

Further advantages of the invention can be gathered from the description and the drawing. The features mentioned above and below may be utilized according to the invention either individually or in arbitrary combination. The embodiments shown and described are not to be taken as exhaustive enumeration but rather have exemplary character for describing the invention.

The invention is shown in the drawing and will be explained in detail by means of embodiments, wherein:

DESCRIPTION OF THE PREFERRED EMBODIMENT

The magnetic shielding according to the invention comprises a shielding plate below the ceiling of a room, in which a high field NMR magnet of an NMR spectrometer is positioned, the superconducting magnet coil of which, located in a cryostat, comprising a vertical z-axis dependence for generating the static magnetic field. The ferromagnetic shielding plate is thus so far away from the measuring centre of the magnet, that it impairs the homogeneity of the produced magnetic field in the measuring volume to an adequately small extent, so that the interferences produced by it can be eliminated by simple shimming. Furthermore, the considerable distance between the shielding plate and the magnet also makes sure that, during operation no considerable magnetic forces act on the shielding plate and its anchoring provided on the ceiling.

In order to considerably improve the shielding effect with respect to known shielding devices, the shielding plate according to the invention is curved downwardly at least in its edge areas or comprises truncated or pyramid-truncated edge surfaces which project downwardly. In this manner, it can be guaranteed that the stray field of the NMR magnet cannot enter a room above the shielding plate along its vertical z-axis and have a negative effect on people or sensitive electronics. With respect to complete spatial shielding according to prior art or "temple-shaped" shielding devices, the plate according to the invention offers furthermore considerable advantages with respect to weight and assembly.

Figure 1:
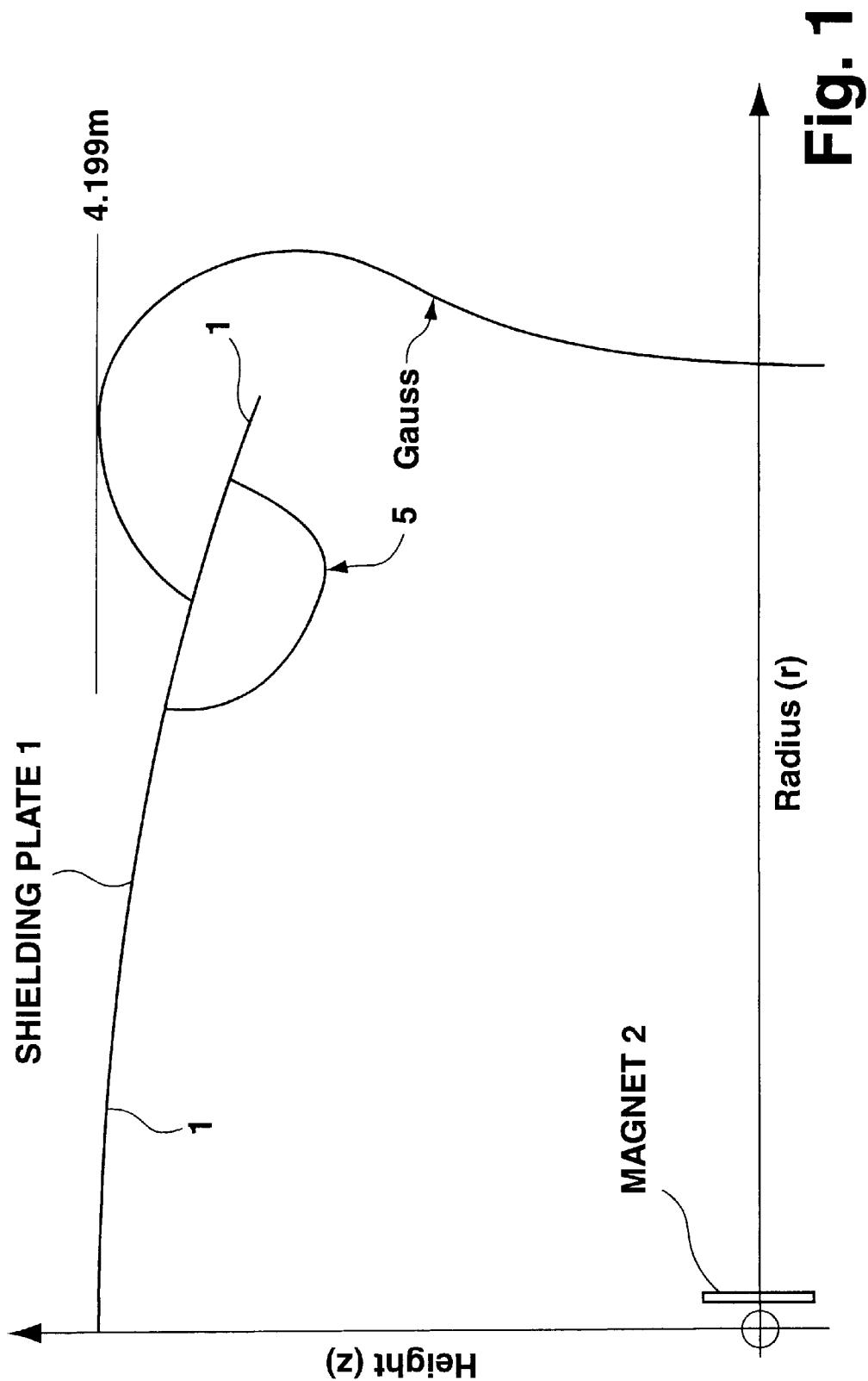
FIG. 1 shows the axial dependence of a 5 Gauss line as a function of the radial distance from the z-axis in a spherical segment shaped shielding plate according to the invention.

FIG. 1 shows half of a shielding plate 1' according to the invention in a line of intersection containing the z-axis (direction of the abscissa r). The shielding plate 1' shown has the shape of a spherical segment and is rotationally symmetric with respect to the z-axis. Its point of intersection with the z-axis is, in the embodiment shown, 4.20 m above the measuring centre of a superconducting 800 MHZ-NMR magnet 2 which is, at the same time, point of intersection of the z-axis and the r-axis. Furthermore, FIG. 1 shows lines of equal field strength of a magnitude of 5 Gauss. The 5 Gauss line of flux projecting beyond the shielding plate 1' on the right-hand edge projects merely in the z-direction to a maximum extent of 4,199 m above zero level of the z-axis. Thus, when the shielding plate 1' shown just reaches the ceiling of a room with its apex, the stray field, at the 5 Gauss level, projecting beyond the edge of the shielding plate 1' in an upward direction does not project into the area of the floor above the ceiling of the room.

Figure 2:
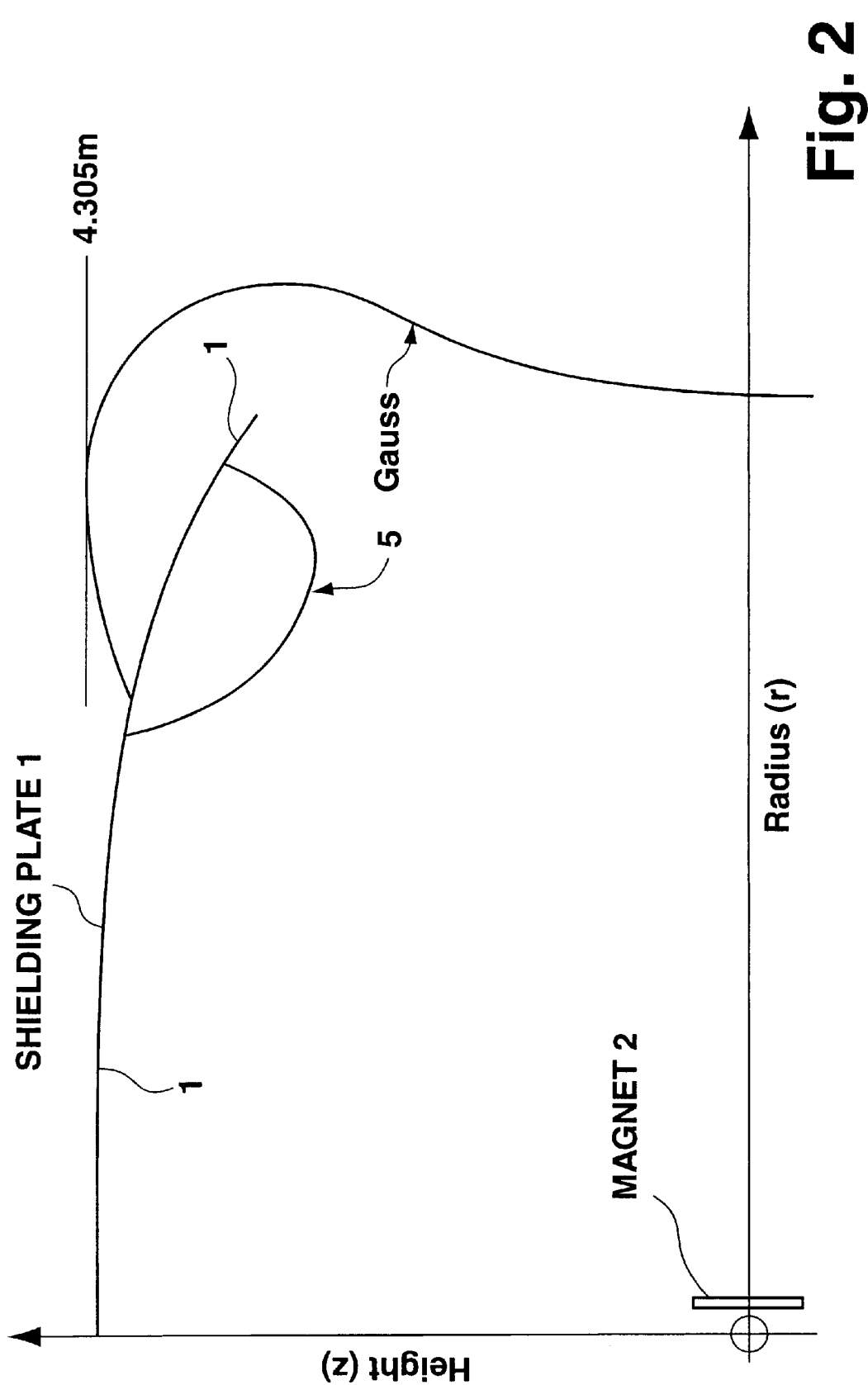
FIG. 2 shows the same as FIG. 1, but in a shielding plate according to the invention which is flat near the z-axis and curved at the edge.

FIG. 2 shows a representation similar to FIG. 1, wherein the shielding plate 1 in this case consists of a circular flat plate in the central area around the z-axis having a radius of 3.00 m and a radially joined edge section having a truncated spherical shape. The 5 Gauss line projects in the z direction to a maximum degree of 4.305 m above the magnet centre, i.e. approximately 0.105 m in the z-direction, beyond the highest point of the shielding plate. Since also the ceiling of the room, to which the shielding plate is mounted, comprises a finite thickness in the z-direction, it is also practically impossible in this case, that the 5 Gauss magnetic line of flux enters the upper floor.

Figure 3:
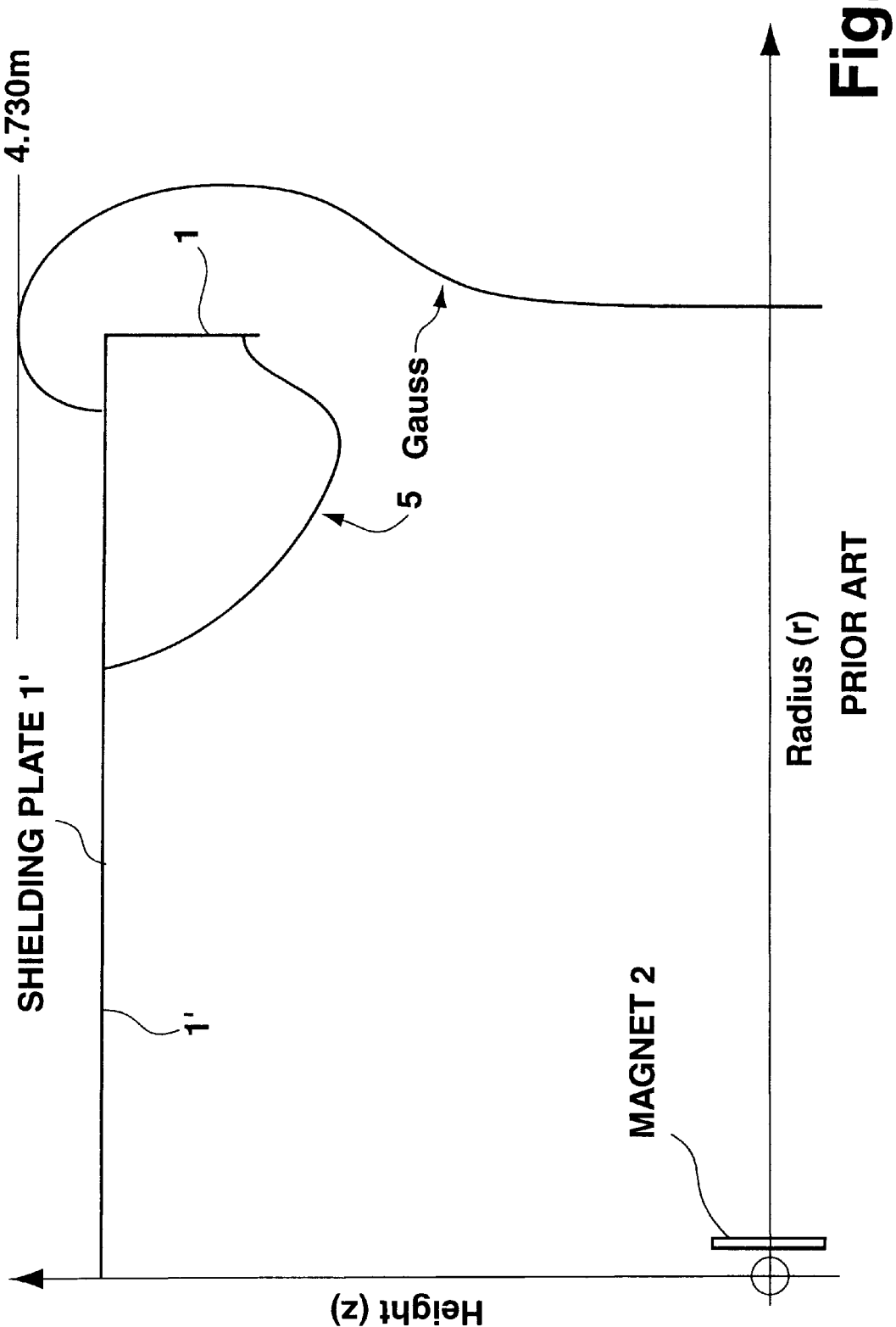
FIG. 3 shows the same as FIG. 1, however, in a conventional canopy-shaped shielding plate.

In comparison therewith, FIG. 3 shows a "canopy-like" shielding plate 1 according to prior art which is also arranged at a height of 4.20 m above the magnet 2 centre. Despite the surrounding apron which projects downwardly by 1 m at the edge of the shielding plates 1', the 5 Gauss line of the magnetic field passes sidewardly past the shielding plate to a level of 4.730 m in the z-direction above the magnet centre. When the shielding plate 1' of FIG. 3 abuts flatly on the ceiling, the 5 Gauss line of flux still extends upwardly into the upper floor by not less than 0.53 m.

Figure 4:
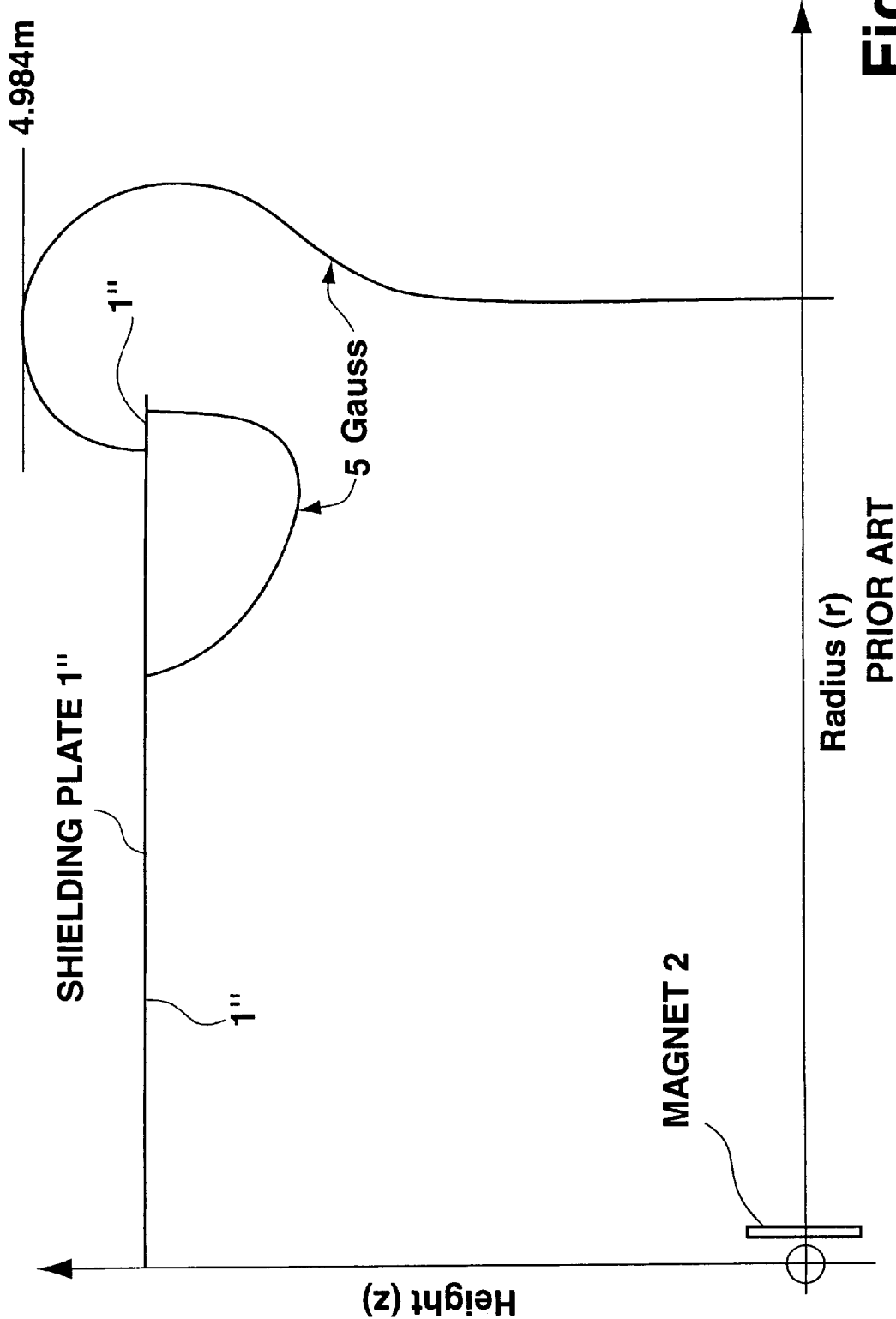
FIG. 4 shows the same as FIG. 1, however, in a conventional flat shielding plate.

The z dependence of the 5 Gauss magnetic line of flux in the flat, circular shielding plate 1" having a radius of 6 m, shown in FIG. 4, and being mounted at a height of 4.20 m above the magnet 2 centre is even more unfavourable. The maximum z-distance between the 5 Gauss line of flux and the zero level is in this case 4.984 m such that the magnetic line of flux projects beyond the highest point of the shielding plate 1" into the upper floor by not less than 0.784 m.

The maximum radial distance between all shielding plates 1, 1', 1" shown in FIGS. 1 to 4 and the z-axis is 6.00 m in each case. While the plane shielding plate 1" in FIG. 4 abuts directly on the ceiling at a height of 4.20 m above the magnet centre, the shielding plates 1, 1' shown in FIGS. 1 through 3 are spaced away at their outermost radial edges by 1 m in the axial direction from the ceiling or the highest point of the shielding plate 1, 1', in each case.

Instead of the spherical segment shaped dependence shown in FIGS. 1 and 2, the curved area of the shielding plate 1 according to the invention may also have a parabolic or hyperbolic shape. Furthermore, the shielding plate 1 according to the invention must not necessarily be arranged rotationally symmetric about the z-axis but may comprise an n-fold symmetry about the z-axis, wherein n will, appropriately, be larger than 3.

Instead of bending the shielding plate 1, it is also possible that at least one truncated or pyramid-truncated area joins radially a plane horizontal area of the shielding plate 1 near the z-axis, which area is inclined towards the horizontal line at an angle theta in a downward direction, wherein $0° < \text{theta} < 90°$, preferably $10° < \text{theta} < 60°$.

In particular, the shielding plate 1 may be completely or partially slitted or laminated, mainly in the curved edge areas.

Figure 5:
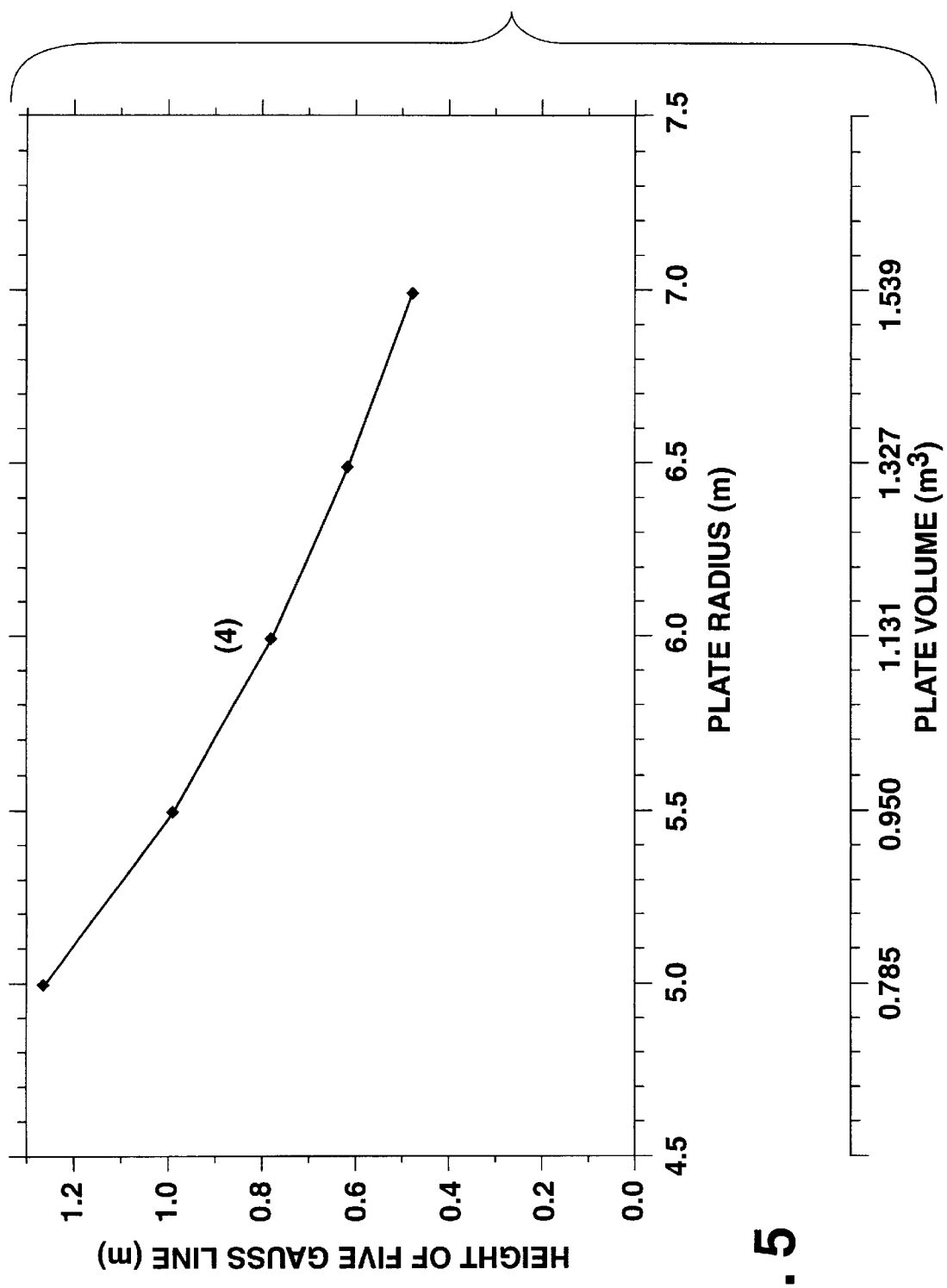
FIG. 5 shows the maximum distance in the direction of the z-axis, to which a 5 Gauss line projects beyond the level of the shielding plate, in case of a flat circular shielding plate, as function of the plate radius or the plate volume.

In the flat, circular, horizontal shielding plate 1" according to prior art in FIG. 5, which is suspended centrally above an 800 MHz magnet 2 at a height of 4.20 m above the magnet 2 centre and comprises a thickness of 1 cm and consists of soft iron, the maximum height in the z direction $H_{56}$ of the 5 Gauss line above the plate 1" level of z=4.20 m is shown as a function of plate radius $R_P$. The lowermost abscissa shows, the corresponding plate volume $V_P$, obtained by simple calculation from the plate radius $R_P$ with the above-mentioned plate thickness.

The point corresponding to a shielding configuration of FIG. 4 is indicated with [4] in the z-R diagram of FIG. 5.

As can be gathered from the representation, the depth of penetration of the 5 Gauss line into the upper floor above the flat shielding plate 1" decreases with increasing radius $R_P$. Even with a plate radius of $R_P$=7.0 m, the depth of penetration in the z-direction is still 0.5 m.

Figure 6:
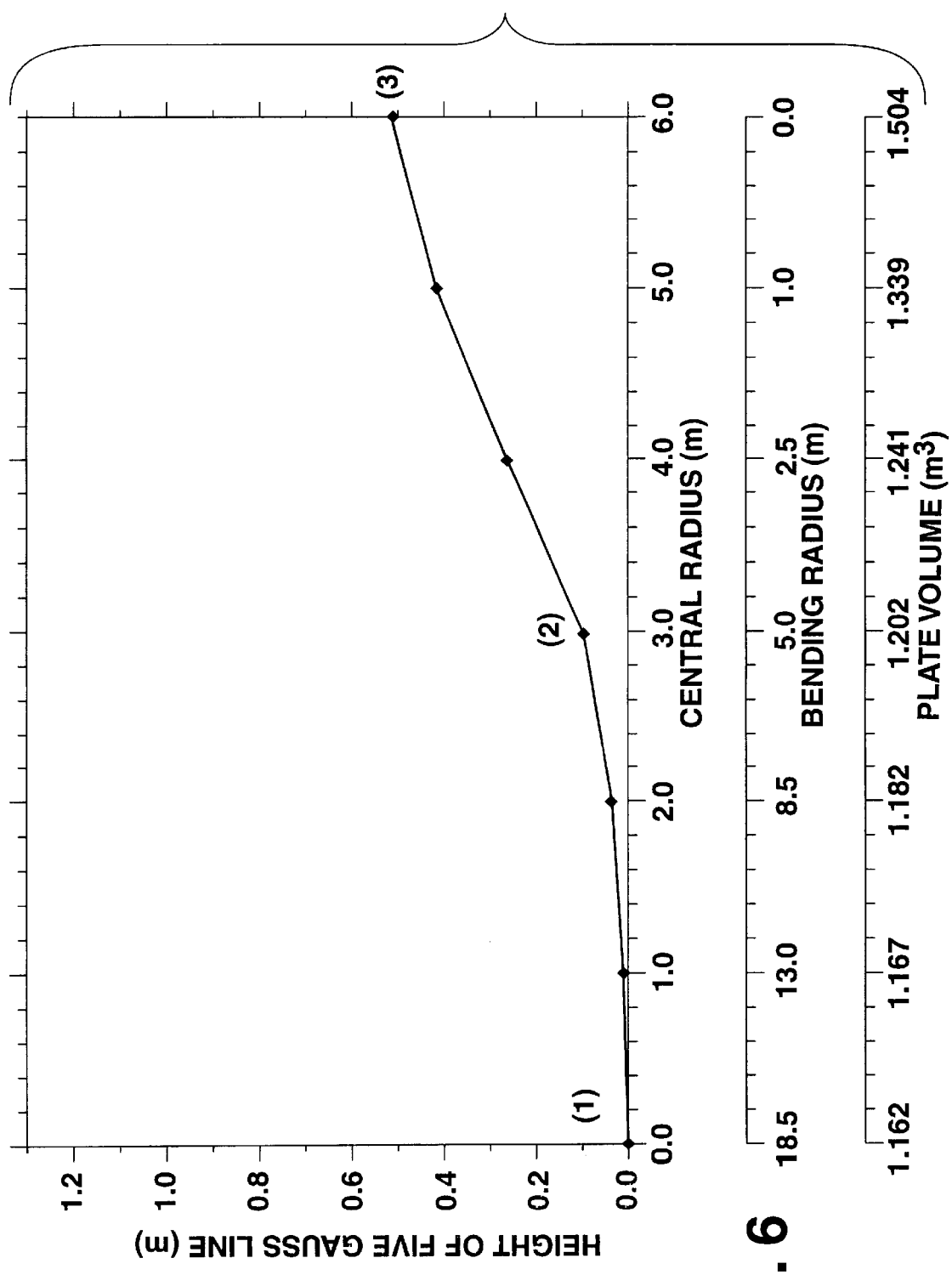
FIG. 6 the maximum distance in the z-direction, to which a 5 Gauss line projects beyond the level of the shielding plate, when using a shielding plate according to the invention having a central, flat, circular section and curved edges, as function of the radius of the central flat inner section and as function of the curvature of radius of the rounded edge and as a function of the plate volume.

In contrast thereto, in FIG. 6 the maximum depth of pentration $H_{56}$ of the 5 Gauss line $H_{56}$ is plotted as a function of the radius $R_C$ of a central flat inner part of a shielding plate 1 according to the invention, which is joined radially in the edge area by a section which is curved downwardly in a truncated manner with a radius of curvature $R_D$. The maximum radius of the entire shielding plate is 6.0 m in each case. Also in this case, the shielding plate 1 was assumed to be in the central area above an 800 MHz magnet 2 at a height of z=4.20 m. The radial edge area of the shielding plate 1 is 1.00 m below the central shielding plate level on the z-axis, in each case, i.e. 3.20 m above the level of the magnet 2 centre. Furthermore, in the calculation it was assumed that the plate thickness was 1 cm and soft iron was used as plate material in order to make the comparison with the situation shown in FIG. 5 as clearly as possible.

FIG. 6 shows a second abscissa, below the $R_C$-abscissa, having the bending radius $R_B$ of the spherical segment-shaped outer section of the shielding plate 1. and A third abscissa axis shows the corresponding plate volume $V_P$. The lower axes are obtained in each case from the uppermost axis by simple conversion.

The points in the z-R-diagram of FIG. 6 which are labelled with [1], [2], [3] correspond to a shielding configuration according to FIG. 1, FIG. 2 and FIG. 3, respectively.

As can be gathered from FIG. 6, at point [1] the best shielding effect is achieved with the shielding plate configured as a pure spherical segment, in which the radius $R_C$ of the central flat inner area has shrunk to 0. With increasing radius $R_C$ of the flat inner central plate section and thus, decreasing portion of the curved part of the plate, the shielding effect is reduced.

However, at point [2], the depth of penetration $H_{56}$ of the 5 Gauss line in the z-direction is in the ceiling area only approximately 0.1 m. Finally, at point [3], the known "canopy" configuration is achieved, in which the depth of penetration $H_{56}$ of approximately 0.5 m is still considerably less than the depth of penetration of approximately 0.8 m when using a flat horizontal plate having the same outer diameter (see point [4] in FIG. 5).

Figure 7:
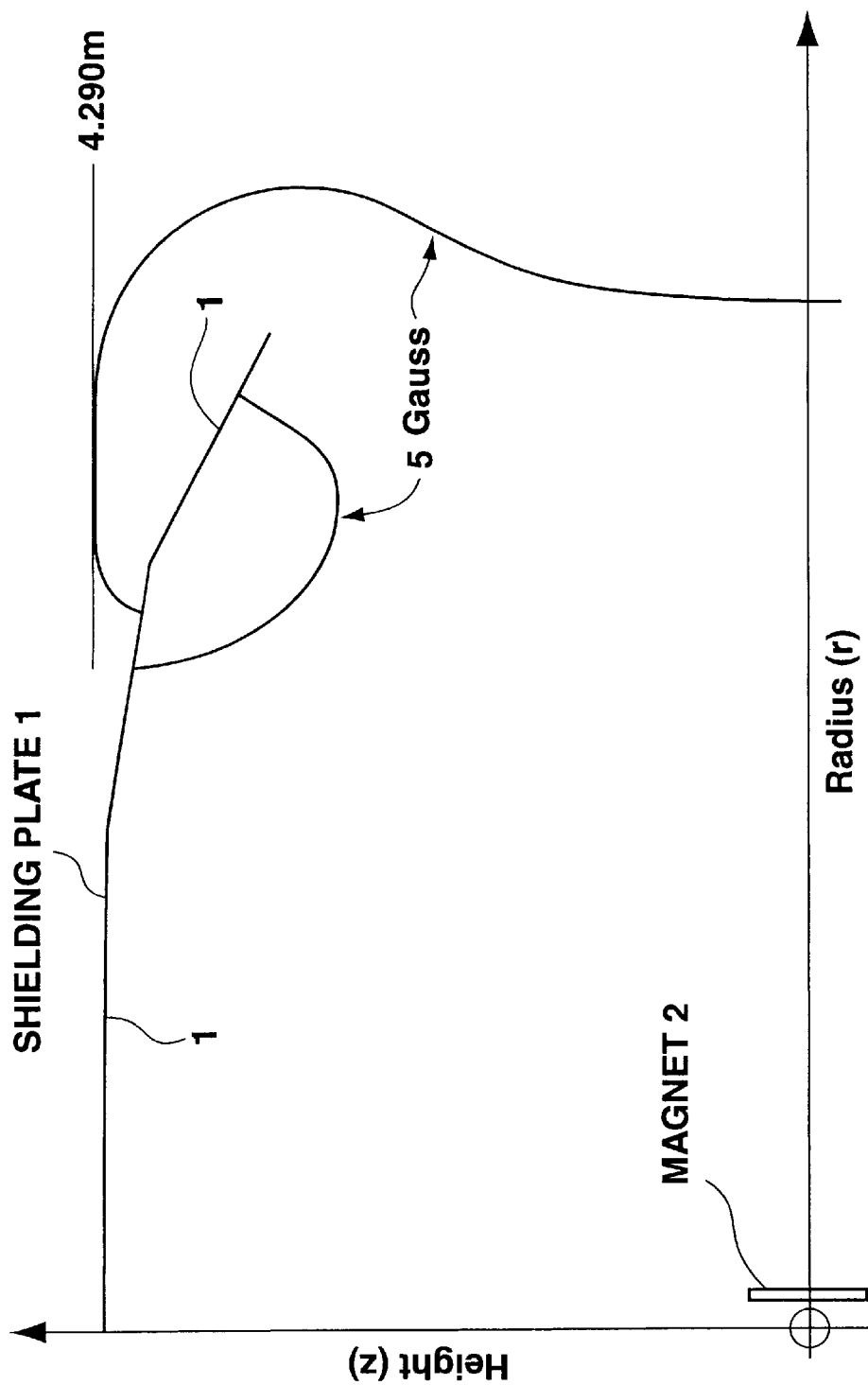
FIG. 7 shows the same as FIG. 2, however, with a truncated or pyramid-truncated dependence at the edges, wherein the drop at the edge is effected in two steps.

FIG. 7 shows an embodiment similar to FIG. 2, wherein the shielding plate 1 has the central area is circular or in the shape of a regular n-sided (n>3) structure (polygon) and comprises two radially joining edge sections of truncated spherical or truncated pyramid configuration. In the second case, the edge sections are composed of flat trapezoidal plates. The angles between adjoining plates are preferably smaller than 20°. The preferred number of parts of the arrangement is eight. The shielding effect and the required iron volume can be compared with the shielding of FIG. 2. The constructive expenditure, however, is smaller.

Finally, it is to be pointed out that the above-mentioned solution of the problem according to the invention, can be applied to magnetic field shielding from a lower floor, in which case the shielding plate has to be mounted correspondingly below the magnet with the curvature of the edge of the plate extending upwardly. The inventive idea can also be used for the lateral spatial shielding in magnets having a horizontal z-axis. In this case, the curvature of the edge of the corresponding inventive shielding plate has to face again the magnet to be shielded.

The invention can be transferred also to the shielding of magnets outside NMR applications.

I claim:

1. A passive magnet shielding for a superconducting magnet coil, the coil supported on a floor of a room, the coil having a vertical axis for generating a static magnetic field of a homogeneity of $<10^{-7}$ in a test volume of a nuclear magnetic resonance (NMR) spectrometer, wherein the passive shielding consists essentially of a ferromagnetic shielding plate disposed above the magnet coil proximate to a ceiling of the room to separate the shielding from the magnet coil by a gap, the shielding plate comprising a horizontal central section and a curved edge section adjacent to said central section at a radial separation from the vertical axis, the curved edge section having a vertical height above the floor which decreases at increasing radial separations from the vertical axis, wherein the shielding plate is separated and isolated from the magnet coil.

2. The magnetic shielding of claim 1, wherein said curved edge section comprises flat plates which are downwardly inclined with increasing radial separations from the vertical axis at an angle theta, wherein 10°<theta<60°, the flat plates having one of a truncated conical and truncated pyramid shaped surface.

3. The magnet shielding of claim 1, wherein the shielding plate is rotationally symmetric about the vertical axis.

4. The magnet shielding of claim 2, wherein the shielding plate is rotationally symmetric about the vertical axis.

5. The magnet shielding of claim 1, wherein the shielding plate has the shape of a spherical shell segment.

6. The magnet shielding of claim 3, wherein said curved edge section of the shielding plate has a parabolic shape.

7. The magnet shielding of claim 1, wherein the shielding plate has a shape of a regular n-sided structure about the vertical axis with n>3, preferably n=8.

8. The magnet shielding of claim 2, wherein the shielding plate has a shape of a regular n-sided structure about the vertical axis with n>3, preferably n=8.

9. The magnet shielding of claim 1, wherein said central section and said edge section have a downward curvature.

10. The magnet shielding of claim 2, wherein the shielding plate has a shape of a regular n-sided structure about the vertical axis with n>3, preferably n=8, wherein the horizontal central section is joined radially by at least one of said edge section which is composed of n flat trapezoidal plates.

11. The magnet shielding of claim 10, wherein the central section is joined radially by exactly two edge sections.

12. The magnet shielding of claim 11, wherein the angles between two adjacent edge sections are both <20°.

13. The magnet shielding according to claim 11, wherein the angles between two adjacent edge sections are both <20°.

14. The magnet shielding of claim 1, wherein the shielding plate is at least one of slotted and laminated at least in the edge sections.

15. The magnet shielding of claim 2, wherein the shielding plate is at least one of slotted and laminated at least in the edge sections.

* * * * *